US011456085B2

(12) United States Patent
Mandrillon et al.

(10) Patent No.: US 11,456,085 B2
(45) Date of Patent: Sep. 27, 2022

(54) CYCLOTRON FACILITY FOR PRODUCING RADIOISOTOPES

(71) Applicant: AIMA DEVELOPPEMENT, Nice (FR)

(72) Inventors: Pierre Mandrillon, Saint-Jeannet (FR); Jérôme Mandrillon, Nice (FR)

(73) Assignee: AIMA DEVELOPPEMENT, Nice (FR)

( * ) Notice: Subject to any disclaimer, the term of this patent is extended or adjusted under 35 U.S.C. 154(b) by 942 days.

(21) Appl. No.: 16/313,565

(22) PCT Filed: Jun. 26, 2017

(86) PCT No.: PCT/EP2017/065731
§ 371 (c)(1),
(2) Date: Dec. 27, 2018

(87) PCT Pub. No.: WO2018/001974
PCT Pub. Date: Jan. 4, 2018

(65) Prior Publication Data
US 2019/0228871 A1    Jul. 25, 2019

(30) Foreign Application Priority Data

Jun. 29, 2016 (FR) .................................. 1656109

(51) Int. Cl.
*G21G 1/10* (2006.01)
*G01R 33/385* (2006.01)
(Continued)

(52) U.S. Cl.
CPC .............. *G21G 1/10* (2013.01); *G01R 33/385* (2013.01); *G21G 1/001* (2013.01); *G21G 4/04* (2013.01)

(58) Field of Classification Search
CPC . G21G 1/10; G21G 1/001; G21G 4/04; G01R 33/385
(Continued)

(56) References Cited

U.S. PATENT DOCUMENTS 3,571,734 A * 3/1971 Consoli .................... H05H 1/46
376/112
4,139,777 A    2/1979 Rautenbach
6,130,926 A   10/2000 Amini

FOREIGN PATENT DOCUMENTS

FR         2332676 A1    6/1977
FR         2997603 A1    5/2014
WO      2014068477 A1    5/2014

OTHER PUBLICATIONS

Corresponding International Application, Application No. PCT/EP2017/065731 Search Report, dated Sep. 5, 2017, 4 pgs.

* cited by examiner

*Primary Examiner* — Jack W Keith
*Assistant Examiner* — Daniel Wasil
(74) *Attorney, Agent, or Firm* — Ronald M. Kachmarik; Cooper Legal Group LLC

(57) ABSTRACT

A facility for producing radioisotopes. The facility includes at least one target holder. The target holder is configured to receive a target that includes a compound to be irradiated with an accelerated particle beam. The facility includes a cyclotron for producing the accelerated particle beam. The cyclotron includes at least one accelerating cavity within which the beam is subjected to a radiofrequency electric field in order to be accelerated and to a magnetic field enabling it to travel through the cavity several times, describing orbits about an axis of the cyclotron. The magnetic field is produced by at least one coil. The at least one target holder is inside the at least one coil as observed along
(Continued)

Figure 1:
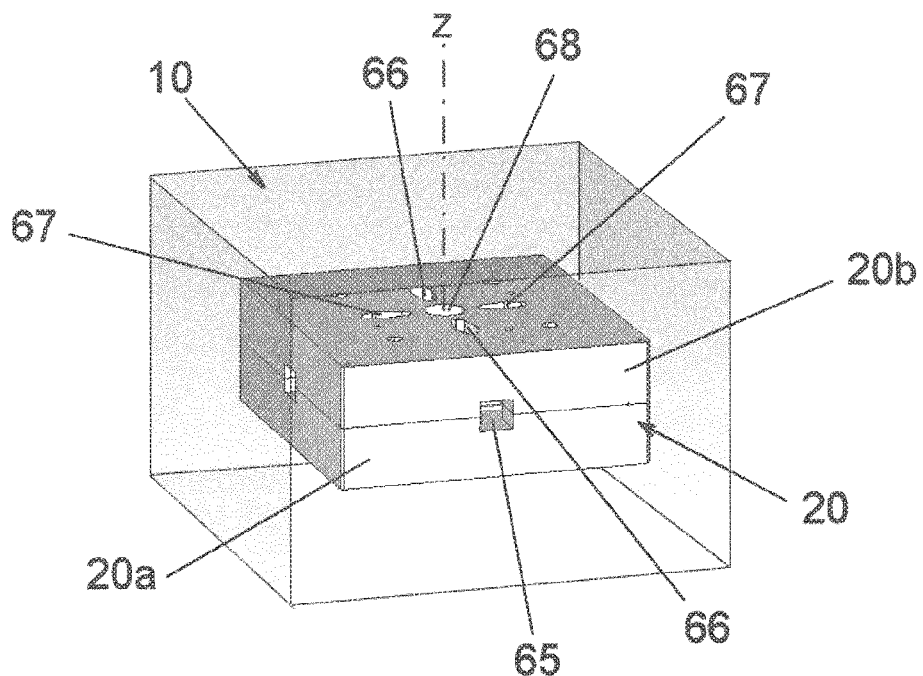

the axis of the cyclotron. The at least one coil does not have symmetry of revolution about the axis.

19 Claims, 5 Drawing Sheets

(51) Int. Cl.
*G21G 1/00* (2006.01)
*G21G 4/04* (2006.01)

(58) Field of Classification Search
USPC .......................................... 376/112, 194, 195
See application file for complete search history.

CYCLOTRON FACILITY FOR PRODUCING RADIOISOTOPES

The present invention relates to the production of radioisotopes and more particularly, but not exclusively, to radioisotopes for medical use, such as $^{18}$F, $^{11}$C, $^{13}$N or $^{15}$O.

Some radioisotopes are increasingly used in the production of markers for medical imaging or for radio-immunotherapy.

The half-life thereof is relatively short, encouraging production close to the site of use.

These radioisotopes are produced by irradiating a target with an accelerated particle beam.

Cyclotrons constitute particularly suitable accelerators for this production, since they are relatively compact compared to linear accelerators. Nonetheless, their set-up is accompanied by radioprotection measures, which end up still making the facility quite cumbersome and problematic.

There is consequently a need to facilitate the production of radioisotopes and especially to be able to benefit from a compact and reliable facility that is easy to set up close to centers of use, or even to patients to be examined by PET imaging.

The invention aims to meet this need, and accomplishes this by virtue of a facility for producing radioisotopes, comprising:
 at least one target able to receive a compound to be irradiated with an accelerated particle beam,
 a cyclotron for producing said accelerated particle beam, comprising at least one accelerating cavity within which the beam is subjected to a radiofrequency electric field in order to be accelerated and to a magnetic field enabling it to travel through the cavity several times, describing orbits about an axis Z of the cyclotron, this magnetic field being produced by at least one coil, in which facility the target is inside the coil when the latter is observed along the axis Z of the cyclotron, the coil not having symmetry of revolution about this axis Z.

Such a facility has a number of advantages.

First of all, the fact that the target is inside the coil makes it possible to utilize the yoke of the cyclotron as radioprotective shielding against the radiation emitted by the target, which both reduces the need for radioprotection outside this yoke and makes it possible to significantly decrease the weight and bulk of the facility.

Next, the shape of the coil, without symmetry of revolution, makes it possible to create a space within the cyclotron where the target can be accommodated, while retaining a compact facility.

The coil may thus have a varying distance to the axis Z and the target is preferably adjacent to a region chosen from the region or regions furthest from the axis Z. The coil may have a varying radius of curvature and the target may be adjacent to a region chosen from the region or regions having the smallest radius of curvature. The coil may have a generally polygonal shape and the target may be located in the vicinity of a corner of the polygon. The coil may especially have a generally triangular, square or rectangular shape, preferably a square shape.

The abovementioned space may be utilized to accommodate therein not only the target but also a radioprotective shielding of the coil, extending between the target and the coil, which reduces the dose received by the insulating materials composing the coil, thereby prolonging the service life thereof.

The accelerated particle beam may extend between altitudes z1 and z2 along the axis Z of the cyclotron and the coil may extend at least partially into this interval of altitudes [z1, z2]. In other words, with such a configuration, if the target were not internal, the beam would not be able to be extracted without intercepting the coil.

The cyclotron may be of any type, and preferably the cyclotron contains magnetic sectors, these preferably being four in number. These sectors define strong-field regions, referred to as hills, and weak-field regions, referred to as valleys.

The sectors ensure deviation of the accelerated particles in order to enable them to describe orbits about the axis Z and to be accelerated to the required energy. These sectors may be formed by opposite poles of the yoke of the cyclotron, which is preferentially made of magnetic steel.

Preferably, as mentioned above, the facility comprises a radioprotective shielding between the target and the coil or coils, and this shielding is preferably made of lead.

Preferably, the shielding locally substantially matches the shape of the rear of the magnetic sector. The shielding may substantially match the shape of the space between the rear of the sector and the coil.

Also preferably, the coil is singular. In this case, it passes through the median plane. As a variant, two coils that are axially close together may be used.

The cyclotron may have a yoke with an outer contour in any shape whatsoever, but preferably with a general shape that is substantially homothetic to that of the coil when observed along the axis Z. Viewed along the axis Z, the yoke may have a contour with a generally square shape, with edges parallel to those of the coil when the latter is of generally square shape.

The cyclotron may comprise a vacuum chamber, optionally delimited, especially at the periphery thereof, by a magnetic material, especially magnetic steel, preferably that of the yoke. As a variant, the vacuum chamber is at least partially delimited by a wall attached to the yoke, for example made of steel or aluminum. The vacuum chamber may be delimited by a wall integrated to a lower or upper pole, this wall preferably comprising a seal groove.

The particles accelerated by the accelerating cavity or cavities may be H⁻ or D⁻ ions.

The distance traveled by the accelerated particles in the target is preferably greater than or equal to 8 cm for a gaseous target, enabling a relatively high production yield of radioisotopes.

The target may be accommodated in a housing formed in the yoke of the cyclotron, this housing preferably being formed by machining.

Another subject of the invention, according to another aspect thereof, is the use of a facility according to the invention and as defined above for the production of radioisotopes, preferably for medical use, especially $^{18}$F, $^{11}$C, $^{13}$N and $^{15}$O.

Another subject of the invention is the compact cyclotron per se.

Figure 2:
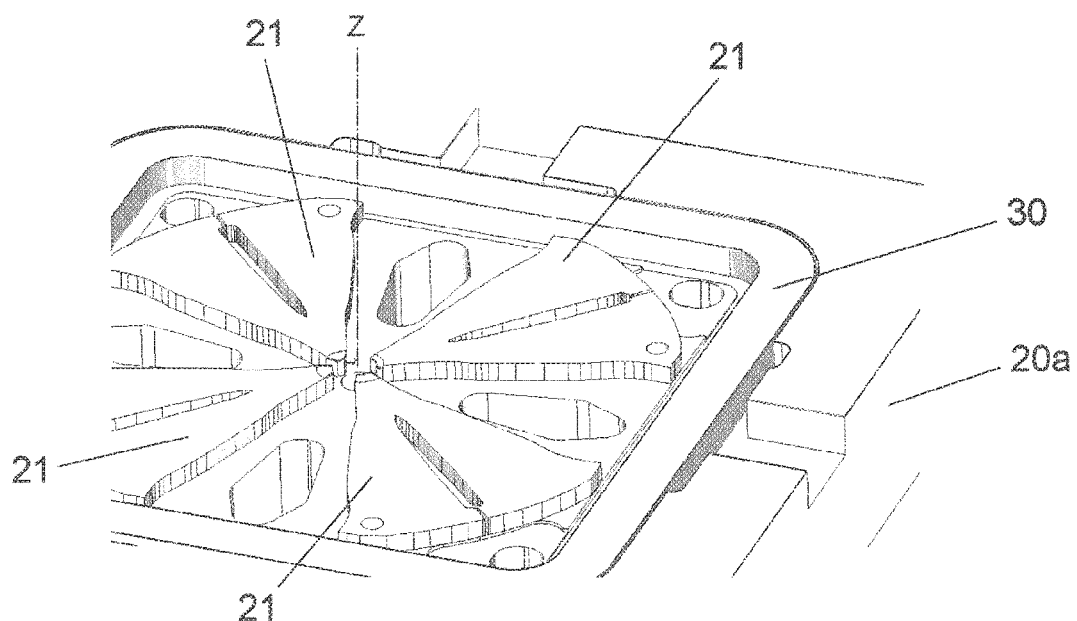
Figure 3:
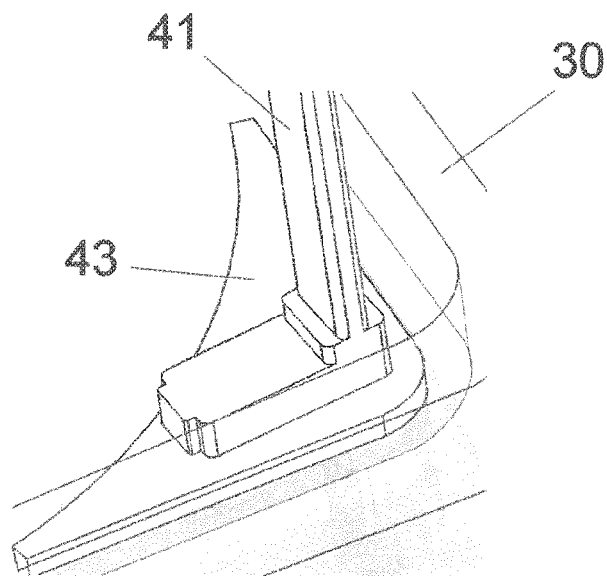
Figure 4:
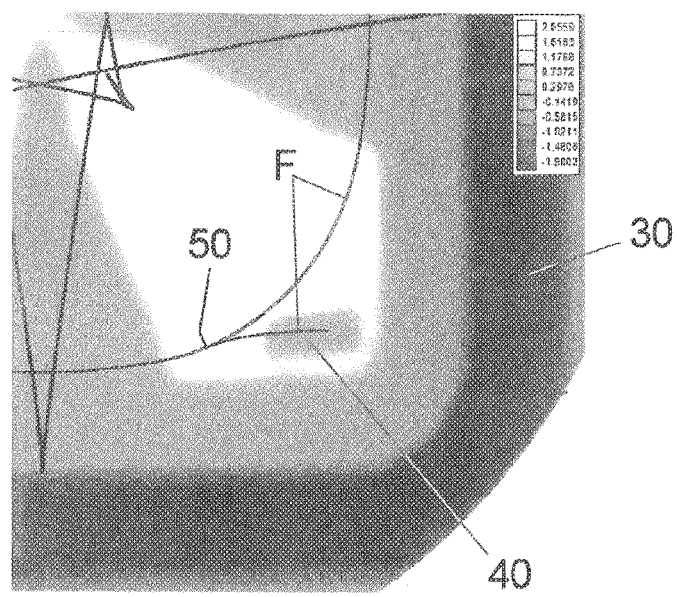
Figure 5:
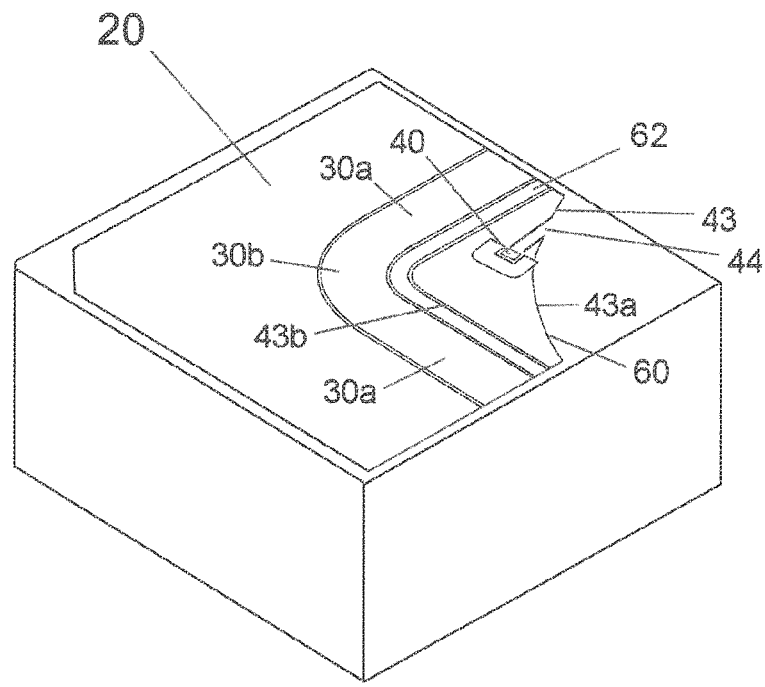
Figure 6:
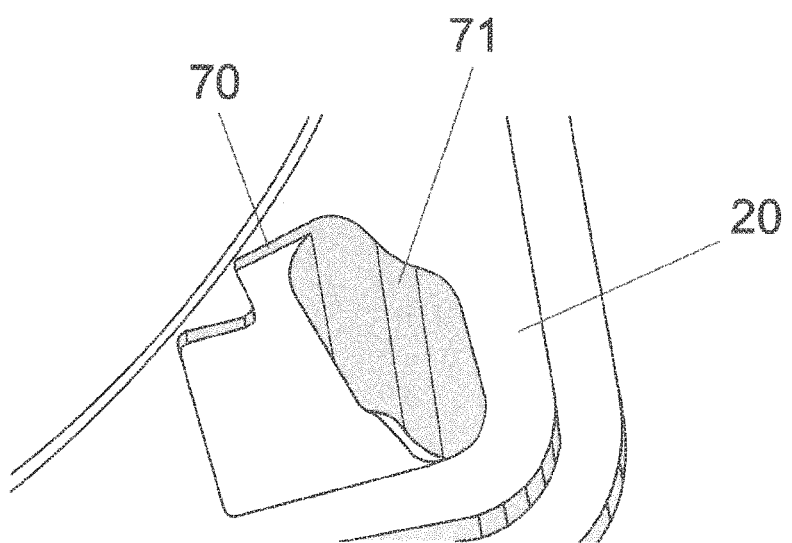
Figure 7:
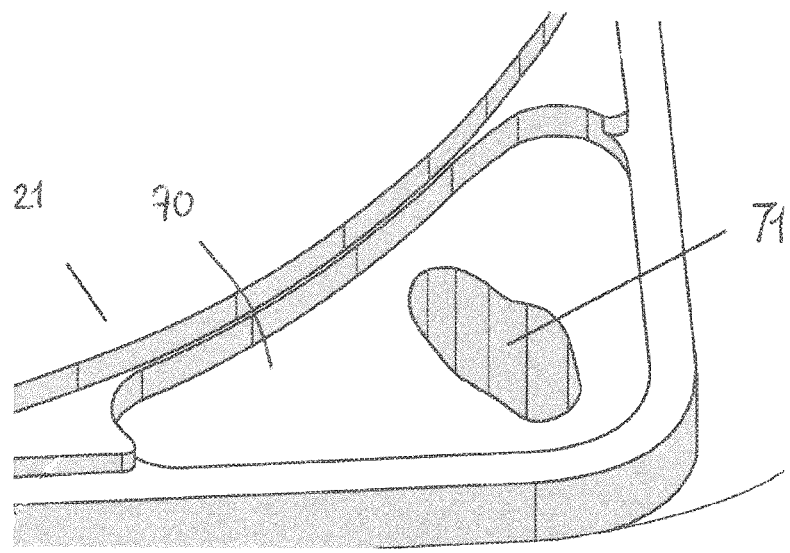
Figure 8:
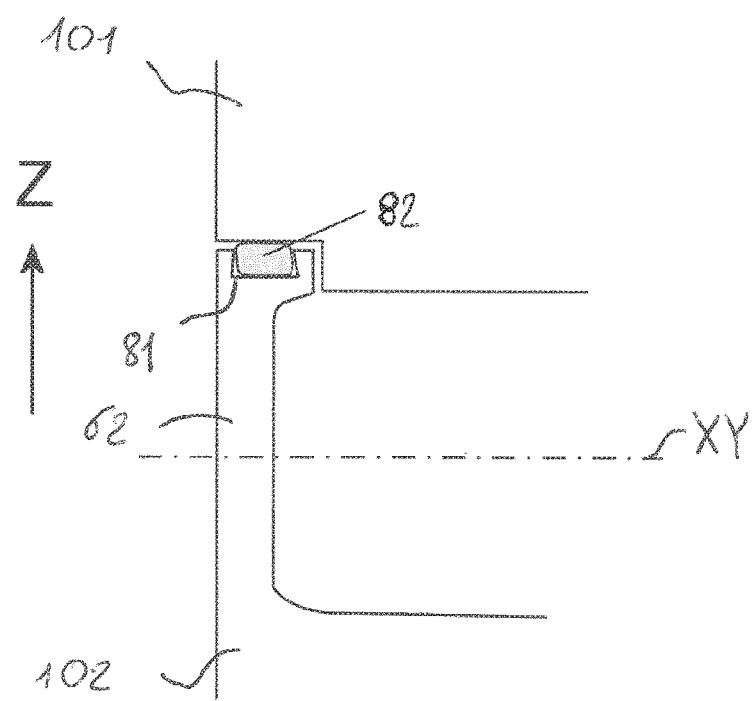
Figure 9:
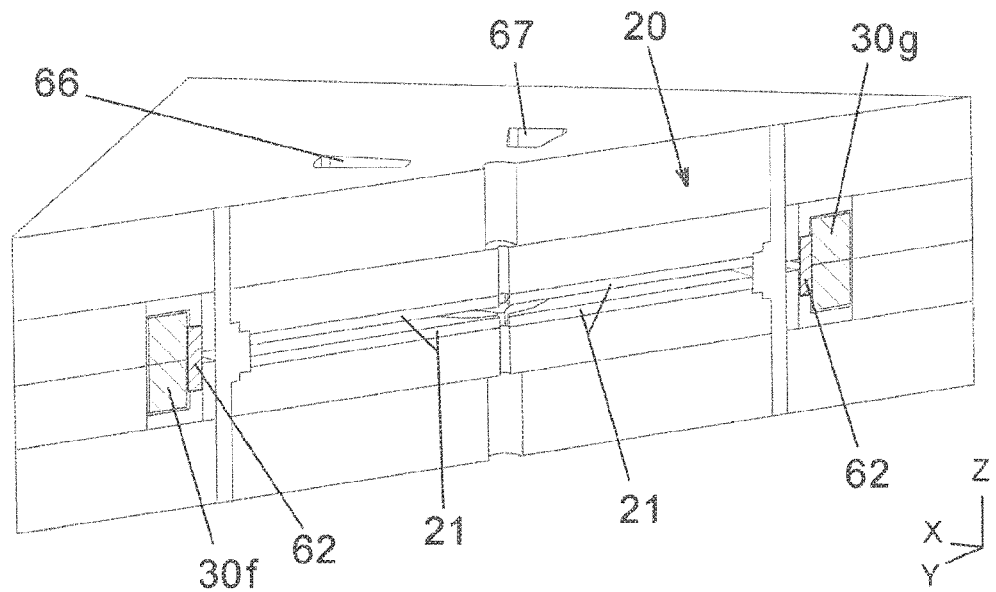
Figure 10:
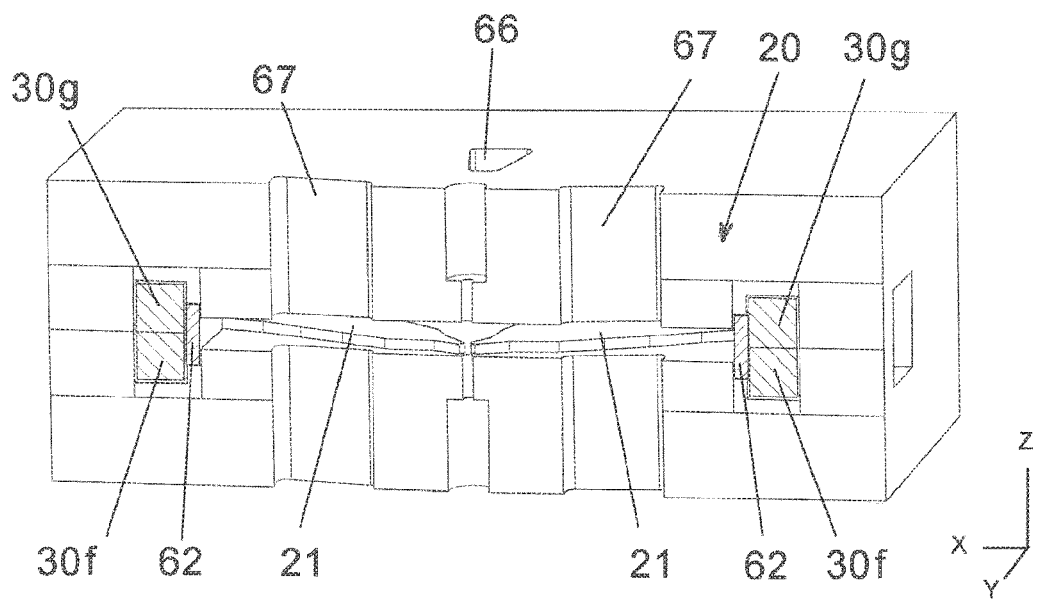

The invention will be able to be better understood on reading the following detailed description of nonlimiting exemplary embodiments of the invention, and on examining the appended drawing, in which:

FIG. 1 is a schematic perspective view of an example facility, showing some constituent elements transparently, FIG. 2 is a partial section at the median plane of acceleration of the cyclotron of the facility of FIG. 1, FIG. 3 shows, in perspective, a detail of the assembly of target and support thereof, FIG. 4 illustrates the extraction of the beam on the target, FIG. 5 is a section illustrating a detail of production of the shielding surrounding the target, FIGS. 6 and 7 show machining variants for the housing for receiving the target, FIG. 8 shows a possibility of a particularly simple vacuum chamber which connects the upper and lower poles, FIGS. 9 and 10 are two sections, respectively taken in the axis of the hills and in the axis of the valleys, illustrating the possibility of using two coils that are close together.

The facility 10 according to the invention, shown in FIG. 1, comprises a light self-shielding containing the compact cyclotron, the yoke 20 of which can be seen by transparency.

In a manner known per se, the cyclotron comprises a source of ions to be accelerated, not shown, which may be internal or external, in a central location 68.

The ions produced by the source are for example H⁻ or D⁻ ions, but the invention is not limited to a particular type of ions.

The yoke 20 comprises lower 20a and upper 20b assembled parts made of magnetic steel.

In the example under consideration, and as illustrated more particularly in FIG. 2, the cyclotron has four magnetic sectors 21 formed with the yoke. The parts 20a and 20b constitute the yoke returns. The invention is not limited to a particular number of sectors.

The median plane of acceleration XY is perpendicular to the axis Z of the cyclotron, around which the orbits occur.

The trajectory of the H⁻/D⁻ ions is curved under the effect of the magnetic field prevailing between the poles in the hills, this field being substantially parallel to the axis Z of the machine.

A radiofrequency (HF) electric field makes it possible to accelerate the particles, in a manner known per se. It is produced by accelerating cavities each forming a radiofrequency resonator located between the sectors. These cavities have three separate parts: the electrodes, referred to as "dees", the edge of which defines the accelerating spaces, their supports, referred to as "stems", and the whole of the HF bulk of the resonator, referred to as "liner".

The stems provide the connection between the electrodes and the liner. They emerge by holes 66 in the yoke 20. The HF power is supplied to the cyclotron by a coupling loop located in the holes 66.

In FIG. 1, aside from the location of the holes 66 for the passage of the stems, holes 67 can be seen, which are reserved for pumping of the cyclotron.

The magnetic field is generated by a coil 30 internal to the cyclotron, arranged around the magnetic poles of the cyclotron, within the yoke 20.

This coil 30 preferably contains ordered electrical conductors, for example arranged in the form of several layers stacked along the Z axis, each formed of several turns extending parallel to the plane XY.

The coil 30 extends axially along the axis Z in an interval of altitudes $Z_1$ to $Z_2$, which contains the altitude 0 of the median plane of acceleration XY. The coil 30 therefore passes through the median plane XY.

When observed from above along the axis Z, the coil 30 has a general shape without symmetry of revolution, having for example a polygonal contour, especially of generally square shape, as illustrated. More specifically, in the example under consideration, and as can be seen more particularly in FIG. 5, the coil 30 extends along straight segments 30a arranged as the edges of the square, connected by rounded portions 30b due to the minimal curvature that should be retained so as not to damage the electrical conductors.

This polygonal shape makes it possible to fit, in the corners of the coil 30, on the radially interior side thereof, spaces that may each receive a target 40. In the example under consideration, the facility only comprises one target 40, but as a variant it comprises several thereof. The total thickness of the target, along the axis Z, is for example between 50 and 60 mm.

The beam F of accelerated particles is directed towards this target 40, which contains the compound to be transformed. Said compound is preferably in gaseous form to facilitate conveying it and extracting it from the target by at least one duct 41 which extends for example parallel to the axis Z, as illustrated in FIG. 3.

The energy of the beam is for example between 2 and 20 MeV.

Since the yoke 20 is closed, the magnetic steel thereof contributes to the radioprotective shielding.

The height of the yoke may be between 300 and 500 mm.

With reference to FIG. 4, it can be seen that an electron stripper 50 for the negative ions may be arranged on the final orbit, to strip the H⁻/D⁻ ions and convert them to H⁺/D⁺ ions with a view to extracting them toward the target 40. The target 40 is thus placed close to the stripper 50, in the path of the stripped H⁺/D⁺ ions.

The target 40 is placed inside a radioprotective shielding 43, preferably made of lead, as can be seen in FIG. 5.

This shielding 43 is received with the target 40 in a housing 60 made for example by machining the yoke, in the space made by virtue of the angle given locally to the coil 30.

The shielding 43 may locally match, on the radially interior side 43a thereof, the shape of the sector, and on the radially exterior side 43b thereof, the shape of the coil 30.

In the planes XZ and YZ, the shielding 43 is set up substantially level with the yoke 20, without any complex geometry to be worked around.

Different materials may be used to produce the shielding 43, but lead is preferred.

A vacuum chamber wall 62, made of aluminum for example, may insulate the coil 30 from the inside of the cyclotron and guarantee vacuum tightness. The coil 30 is therefore in the air.

The shielding 43 is passed through by a channel 44 via which the beam is conveyed to the target 40.

An outlet 65 may be made in the yoke 20, as can be seen in FIG. 1, for the exit of the electrical conductors connected to the coil.

The footprint of the yoke 20 per se is preferably less than 1.5 m².

The invention is not limited to the example which has just been described. In particular, the electrical connections of the coils may be placed differently, as may the hydraulic connections for cooling them. The cyclotron may be sectorless.

FIG. 6 illustrates a specific machining possibility for the yoke 20 around the target, with a depression 70 that only extends on one side of a passage 71 for the outlet duct 41, which does not appear on this figure. This may make it possible to benefit from a slightly higher energy, but complicates the machining of the poles to adapt the depression 70 to the geometry of the target.

As a variant, the angle of the yoke is completely machined, as illustrated in FIG. 7, which has the advantage of simplifying the manufacture, of offering more space for the target and of improving the radioprotection.

FIG. 8 illustrates the possibility of integrating the vertical wall 62 of the vacuum chamber to the lower pole 102 with a seal groove 81 receiving a seal 82 for ensuring the tightness between the assembled upper 101 and lower 102 poles. This reduces the manufacturing cost.

In FIGS. 9 and 10, the possibility of producing the coil 30 with two separated superimposed parts 30f and 30g, which are very close to one another, is illustrated.

The expression "comprising one" must be understood to be synonymous with "comprising at least one".

The invention claimed is:

1. A facility for producing radioisotopes, comprising:
   at least one target holder, the at least one target holder is configured to receive at least one target comprising a compound to be irradiated with an accelerated particle beam,
   a cyclotron for producing said accelerated particle beam, comprising at least one accelerating cavity within which the beam is subjected to a radiofrequency electric field in order to be accelerated and to a magnetic field enabling it to travel through the cavity several times, describing orbits about an axis of the cyclotron, this magnetic field being produced by at least one coil,
   wherein said at least one target holder is inside said at least one coil as observed along the axis of the cyclotron, said at least one coil not having symmetry of revolution about the axis.

2. The facility as claimed in claim 1, said at least one coil having a varying distance to the axis and said at least one target holder being adjacent to a region of said at least one coil chosen from the region or regions furthest from the axis.

3. The facility as claimed in claim 1, said at least one coil having a varying radius of curvature and said at least one target holder being adjacent to a region of said at least one coil chosen from the region or regions having the smallest radius of curvature about the axis.

4. The facility as claimed in claim 1, said at least one coil having a polygonal shape and said at least one target holder being located in the vicinity of a corner of the polygon.

5. The facility as claimed in claim 1, the accelerated particle beam extending between altitudes z1 and z2 along the axis of the cyclotron and said at least one coil extending at least partially into this interval of altitudes (z1, z2).

6. The facility as claimed in claim 1, the cyclotron comprising four magnetic sectors.

7. The facility as claimed in claim 6, comprising a shielding between said at least one target holder and said at least one coil.

8. The facility as claimed in claim 7, the shielding substantially matching the shape of a space between the rear of at least one sector of the cyclotron and said at least one coil.

9. The facility as claimed in claim 7, comprising a shielding made of an assembly of different materials.

10. The facility as claimed in claim 1, said at least one coil being singular and passing through a median plane.

11. The facility as claimed in claim 1, the cyclotron having a magnetic yoke with an outer contour having a substantially same shape as said at least one coil.

12. The facility as claimed in claim 1, the cyclotron comprising a vacuum chamber at least partially delimited by magnetic steel.

13. The facility as claimed in claim 12, the periphery of the vacuum chamber being at least partially delimited by magnetic steel.

14. The facility as claimed in claim 12, the vacuum chamber being delimited by a wall integrated to a lower or upper pole, this wall comprising a seal groove.

15. The facility as claimed in claim 1, the particles accelerated by the accelerating cavity being $H^-$ or $D^-$ ions.

16. The facility as claimed in claim 1, said at least one target holder receiving a gaseous target, the distance traveled by the accelerated particles in said at least one target holder being greater than or equal to 8 cm.

17. The facility as claimed in claim 1, said at least one target holder being accommodated in a housing formed in a magnetic yoke of the cyclotron.

18. A method of using the facility as claimed in claim 1, comprising operating the facility to produce medical radioisotopes.

19. The method as claimed in claim 18, the produced radioisotopes comprising at least one of $^{18}F$, $^{11}C$, $^{13}N$ and $^{15}O$.

* * * * *